United States Patent
Bourcet et al.

(10) Patent No.: US 9,598,539 B2
(45) Date of Patent: Mar. 21, 2017

(54) METHOD OF FORMING POLYMERS

(71) Applicants: Cambridge Display Technology Limited, Godmanchester (GB); Sumitomo Chemical Company Limited, Tokyo (JP)

(72) Inventors: Florence Bourcet, Godmanchester (GB); Kiran Kamtekar, Godmanchester (GB); Ruth Pegington, Godmanchester (GB); James Morey, Godmanchester (GB)

(73) Assignees: Cambridge Display Technology Limited, Godmanchester (GB); Sumitomo Chemical Company Limited, Tokyo (JP)

( * ) Notice: Subject to any disclaimer, the term of this patent is extended or adjusted under 35 U.S.C. 154(b) by 0 days.

(21) Appl. No.: 14/648,622

(22) PCT Filed: Nov. 28, 2013

(86) PCT No.: PCT/GB2013/053146
§ 371 (c)(1),
(2) Date: May 29, 2015

(87) PCT Pub. No.: WO2014/083342
PCT Pub. Date: Jun. 5, 2014

(65) Prior Publication Data
US 2015/0315338 A1    Nov. 5, 2015

(30) Foreign Application Priority Data

Nov. 30, 2012    (GB) .................................. 1221617.2

(51) Int. Cl.
| | | |
|---|---|---|
| C08G 73/02 | (2006.01) | |
| C08G 61/12 | (2006.01) | |
| H01L 51/00 | (2006.01) | |
| C08G 61/00 | (2006.01) | |
| H01L 51/50 | (2006.01) | |

(52) U.S. Cl.
CPC ........... C08G 73/026 (2013.01); C08G 61/12 (2013.01); H01L 51/0039 (2013.01); H01L 51/0043 (2013.01); C08G 2261/124 (2013.01); C08G 2261/148 (2013.01); C08G 2261/1412 (2013.01); C08G 2261/3142 (2013.01); C08G 2261/3162 (2013.01); C08G 2261/3245 (2013.01); C08G 2261/41 (2013.01); C08G 2261/411 (2013.01); C08G 2261/5222 (2013.01); C08G 2261/95 (2013.01); H01L 51/50 (2013.01)

(58) Field of Classification Search
CPC ....................................................... C08G 73/02
USPC ......................................................... 528/397
See application file for complete search history.

(56) References Cited

U.S. PATENT DOCUMENTS

| 6,034,206 A | 3/2000 | Yamamoto et al. |
|---|---|---|
| 2004/0171833 A1 | 9/2004 | Buchwald et al. |
| 2004/0262574 A1 | 12/2004 | Suzuki et al. |

FOREIGN PATENT DOCUMENTS

| CN | 102167801 A | 8/2011 |
|---|---|---|
| EP | 2 112 186 A1 | 10/2009 |
| JP | H11-21349 A | 1/1999 |
| JP | H11-80347 A | 3/1999 |
| JP | 2008-045142 A | 2/2008 |
| WO | WO 03/035714 A1 | 5/2003 |

OTHER PUBLICATIONS

International Search Report and Written Opinion for PCT/GB2013/053146 mailed Jul. 17, 2014.
Office Communication dated Mar. 14, 2013 for Great Brittan Application No. 1221617.2.
Goodson et al., Palladium-Catalyzed Synthesis of Pure, Regiodefined Polymeric Triarylamines. J. Am. Chem. Soc. 1999; 121(33):7527-39.
Littke et al., Palladiumkatalysierte Kupplungen von Arylchloriden. Angew Chem. 2002;114:4351-86.

*Primary Examiner* — Duc Truong
(74) *Attorney, Agent, or Firm* — Wolf, Greenfield & Sacks, P.C.

(57) ABSTRACT

Methods of metal-catalyzed polymerization are described using a metal catalyst of formula (III): wherein $R^3$ in each occurrence is independently selected from $C_{1-10}$alkyl and aryl that may be unsubstituted or substituted with one or more substituents; y is 0 or 2; and $Z^-$ is an anion. Methods described include Buchwald-type and Suzuki-type polymerization.

12 Claims, No Drawings

METHOD OF FORMING POLYMERS

RELATED APPLICATIONS

The present application is a national stage filing under 35 U.S.C. §371 of international PCT application, PCT/GB2013/053146, filed Nov. 28, 2013, which claims priority to United Kingdom patent application, GB 1221617.2, filed Nov. 30, 2012, each of which is incorporated herein by reference.

BACKGROUND OF THE INVENTION

Intrinsically conductive polymers (ICPs) are known for a wide range of applications including use in printed organic circuits and in organic electronic devices such as organic light emitting diodes (OLEDs), organic photoresponsive devices (in particular organic photovoltaic devices and organic photosensors), organic transistors and memory array devices.

One method of forming ICPs is the Buchwald-Hartwig polymerisation process in which an aryl dihalide monomer is reacted with a monomer containing primary or secondary arylamines in the presence of a palladium catalyst. In the Buchwald-Hartwig polymerisation process a C—N bond is formed between an aromatic carbon atom of an aromatic monomer and a N atom of an arylamine monomer.

US 2004/262574 discloses a method of forming polymers according to the following general process:

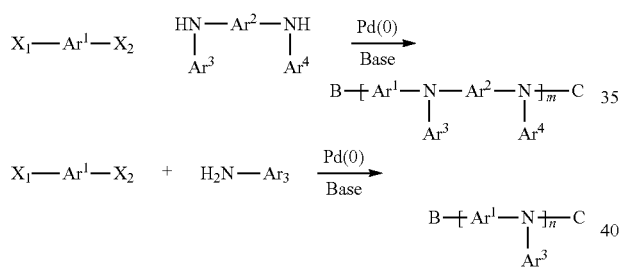

In which $Ar^1$, $Ar^2$, $Ar^3$ and $Ar^4$ are aromatic groups, $X^1$ and $X^2$ are halogens, polymer termini B and C represent a hydrogen or halogen atom, m is an integer of at least 1 and n is an integer of at least 2.

US 2004/262574 discloses use of the catalyst dipalladium tri(dibenzylideneacetone) ($Pd_2(dba)_3$):

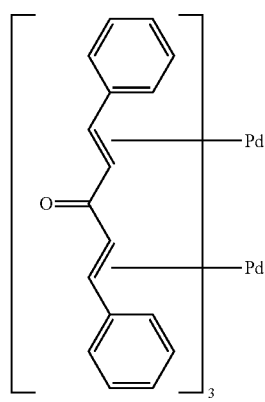

Most polymers exemplified in US 2004/262574 have a weight-average molecular weight of no more than 10,000 Da.

Another method of forming ICPs is Suzuki polymerisation, for example as described in WO 00/53656, WO 03/035796 and U.S. Pat. No. 5,777,070. During Suzuki polymerisation, which takes place in the presence of a palladium catalyst, carbon-carbon bonds form between aromatic carbon atoms of monomers.

WO 00/53656 discloses Suzuki polymerisation in which an aromatic dihalide monomer is polymerised with an aromatic diester monomer. WO 00/53656 discloses formation of poly-(9,9-di(n-octyl)fluorene) according to the following reaction scheme:

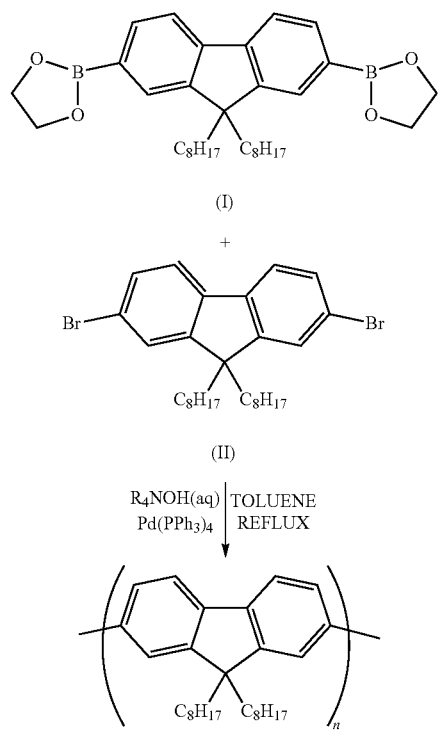

It is an object of the invention to provide a method of forming ICPs that enables control of polymer molecular weight over a wide molecular weight range.

J. Am. Chem. Soc., 2007, 129 (23), pp 7236-7237 discloses chain-growth Suzuki polymerisation at room temperature of a fluorene monomer carrying one bromine reactive group and one boronic ester reactive group.

In some applications it may be desirable to provide ICPs with reactive substituents, such as crosslinkable substituents. It is therefore a further object of the invention to provide a polymerization method that can be carried out at a temperature low enough to avoid activation of reactive substituents during polymerisation, such as crosslinking of crosslinking groups.

SUMMARY OF THE INVENTION

In a first aspect the invention provides a method of forming a polymer by polymerising a monomer of formula (I) with a monomer of formula (II):

$$X—R^1—X \quad (I)$$

$$H—N\underset{R^2}{|}\left(\!(Ar^1)_n—\underset{R^2}{\overset{|}{N}}\!\right)_{\!m}\!\!H \quad (II)$$

wherein:
$R^1$ comprises an aromatic group that may be unsubstituted or substituted with one or more substituents;
$R^2$ independently in each occurrence is a substituent;
$Ar^1$ independently in each occurrence is an aryl or heteroaryl group that may be unsubstituted or substituted with one or more substituents;
X independently in each occurrence is selected from bromine, chlorine, iodine and sulfonic acid esters, and each X is bound to an aromatic carbon atom of R1;
n is a positive integer;
m is 0 or a positive integer; and
the monomers are polymerised in the presence of a preformed palladium catalyst of formula (III):

$$[R^3{}_3P—Pd^{y+}—PR^3{}_3]yZ^- \quad (III)$$

wherein $R^3$ in each occurrence is independently selected from $C_{1-10}$ alkyl and aryl that may be unsubstituted or substituted with one or more substituents;
y is 0 or 2; and
$Z^-$ is an anion.

In a second aspect the invention provides a method of forming a polymer by polymerising a composition comprising at least one monomer of formula (IV) and at least one monomer of formula (V) at a temperature of less than 80° C.:

$$LG^1\text{-}R^{13}\text{-}LG^1 \quad (IV)$$

$$LG^2\text{-}R^{14}\text{-}LG^2 \quad (V)$$

wherein:
$R^{13}$ comprises an aromatic group that may be unsubstituted or substituted with one or more substituents;
$R^{14}$ comprises an aromatic group that may be unsubstituted or substituted with one or more substituents;
each $LG^1$ is a leaving group selected from bromine, chlorine, iodine and sulfonic acid esters, and each $LG^1$ is bound to an aromatic carbon atom of $R^{13}$;
each $LG^2$ is a leaving group selected from boronic acids and boronic acid ester and each $LG^2$ is bound to an aromatic carbon atom of $R^{14}$;
the monomers are polymerised in the presence of a palladium catalyst of formula (III):

$$[R^3{}_3P—Pd^{y+}—PR^3{}_3]yZ^- \quad (III)$$

wherein $R^3$ in each occurrence is independently selected from $C_{1-10}$ alkyl and aryl that may be unsubstituted or substituted with one or more substituents, with the proviso that at least one $R^3$ of at least one group $PR^3{}_3$ is $C_{1-10}$ alkyl;
y is 0 or 2; and
$Z^-$ is an anion.

DETAILED DESCRIPTION OF THE INVENTION

Catalyst

The catalyst of formula (III) may be a palladium (0) or palladium (II) catalyst.

The catalyst comprises phosphine ligands $PR^3{}_3$. The $R^3$ groups of one or both groups $PR^3{}_3$ may be the same or different. In one embodiment, one or both groups $PR^3{}_3$ contain $R^3$ groups that are different. One or both groups $PR^3{}_3$ may contain two different $R^3$ groups or three different $R^3$ groups. One or two $R^3$ groups may be alkyl, and the remaining one or two $R^3$ group may be an aryl group, for example phenyl, that may be unsubstituted or substituted with one or more alkyl groups. Each group $PR^3{}_3$ may be the same or different.

In the case of Buchwald polymerisation, at least one $R^3$ of at least one group $PR^3{}_3$ is a $C_{1-20}$ alkyl.
Exemplary phosphine ligands include:
Phenyldialkylphosphine
Trialkylphosphine
Alkyl groups of the phosphine ligand may be selected from linear, branched or cyclic alkyl groups. A preferred alkyl group is t-butyl.

If the catalyst is a Pd (II) catalyst then anions include $C_{1-10}$alkoxy and halides, for example chloride bromide or iodide.
Exemplary catalysts include the following:

The catalyst is preferably provided in a preformed state in the polymerisation mixture at the start of polymerisation.
Buchwald Polymerisation The Buchwald polymerisation process allows formation of C—N bonds between carbon atoms of an aromatic group and NH groups of amines.

A primary amine may undergo Buchwald polymerisation as illustrated in Reaction Scheme 1:

Reaction Scheme 1

$$X—R^1—X \;+\; \underset{R^2}{\overset{NH_2}{|}} \longrightarrow \!\!\left(\!R^1—\underset{R^2}{\overset{|}{N}}\!\right)_{\!n'}$$

wherein $R^1$, $R^2$ and X are as described above, and n' is a positive integer of at least 2.

A diamine may undergo Buchwald polymerisation as illustrated in Reaction Scheme 2:

Reaction Scheme 2

$$X—R^1—X \;+\; H—\underset{R^2}{\overset{|}{N}}—Ar^1—\underset{R^2}{\overset{|}{N}}—H \longrightarrow$$

$$\left(\!R^1—\underset{R^2}{\overset{|}{N}}—Ar^1—\underset{R^2}{\overset{|}{N}}\!\right)_{\!n'}$$

The polymerization mixture may contain only one of each of monomers of formula (I) and formula (II), in which case the resulting polymer will be a regioregular AB copolymer, or it may contain more than one monomer of formula (I) and/or more than one monomer of formula (II).

The molar ratio of monomer (I):monomer (II) may be 50:50, and a maximum molecular weight may be achieved using this monomer ratio. The molecular weight of a polymer may be controlled by varying the molar ratio of the monomers, for example by providing a monomer (I):monomer (II) ratio of <50:50 or 50: <50. Optionally, the number of moles of the monomer or monomers of formula (II) is greater than the number of moles of the monomer or monomers of formula (I).

The present inventors have found that the method of the invention allows formation of high molecular weight polymers, for example polymers with a weight average molecular weight of at least 100,000 Da or at least 200,000 Da up to 1,000,000 Da, particularly at a monomer (I):monomer (II) ratio of 50:50. By varying this molar ratio, molecular weights may be obtained over a wide molecular weight range.

Buchwald polymerization may take place at the reflux temperature of the polymerization mixture, for example in the range of about 60-120° C.

The reaction may take place in the presence of a base. Suitable bases include inorganic and organic bases, for example hydroxides, alkoxides, carbonates, hydrogen carbonates of a metal or $NR^{4+}$ wherein $R^4$ in each occurrence is H or a hydrocarbyl, optionally a $C_{1-10}$ alkyl.

The polymer may be end-capped by addition of an endcapping reactant. Suitable end-capping reactants are aromatic or heteroaromatic materials substituted with only one group X or substituted with an amine having only one N—H bond. End-capping reactants may be added during or at the end of the polymerisation reaction.

The polymerisation reaction may take place in a single organic liquid phase in which all components of the reaction mixture are dissolved, or in which one ore more components are suspended.

Suzuki Polymerisation

The Suzuki polymerisation process is illustrated in Reaction Scheme 3.

As illustrated in Reaction Scheme 3, a monomer for forming repeat units $R^{13}$ having halogen leaving groups Hal undergoes polymerisation with a monomer for forming repeat units $R^{14}$ having leaving groups such as boronic acid or boronic ester groups to form a carbon-carbon bond between aromatic carbon atoms of $R^{13}$ and $R^{14}$:

Reaction Scheme 3

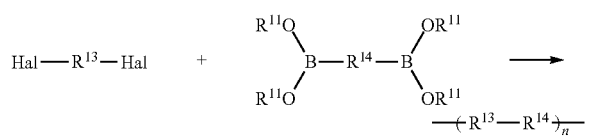

Exemplary boronic esters have formula (VIII):

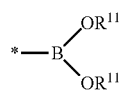

(VIII)

wherein $R^{11}$ in each occurrence is independently a $C_{1-20}$ alkyl group, * represents the point of attachment of the boronic ester to an aromatic carbon atom of the monomer, and the two groups $R^{11}$ may be linked to form a ring. In a preferred embodiment, the two groups $R^{11}$ are linked to form the pinacol ester of boronic acid:

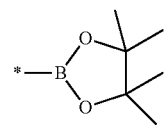 [SMILES: *B1OC(C)(C)C(C)(C)O1]

It will be understood by the skilled person that a dibromo-monomer will not polymerise in the Suzuki polymerisation process to form a direct carbon-carbon bond with another dibromo-monomer. Likewise a diester monomer will not polymerise to form a direct carbon-carbon bond with another diester monomer.

In the example of Scheme 3 above, an AB copolymer is formed by copolymerisation of two monomers in a 1:1 ratio, however it will be appreciated that more than two or more than two monomers may be used in the polymerisation, and any ratio of monomers may be used.

Suzuki polymerisation takes place in the presence of a base. The base may be an organic or inorganic base. Exemplary organic bases include tetra-alkylainmonium hydroxides, carbonates and bicarbonates. Exemplary inorganic bases include metal (for example alkali or alkali earth) hydroxides, carbonates and bicarbonates.

The polymerisation reaction may take place in a single organic liquid phase in which all components of the reaction mixture are soluble. The reaction may take place in a two-phase aqueous-organic system, in which case a phase transfer agent may be used. The reaction may take place in an emulsion formed by mixing a two-phase aqueous-organic system with an emulsifier.

The polymer may be end-capped by addition of an endcapping reactant. Suitable end-capping reactants are aromatic or heteroaromatic materials substituted with only one leaving group. The end-capping reactants may include reactants substituted with a halogen for reaction with a boronic acid or boronic ester group at a polymer chain end, and reactants substituted with a boronic acid or boronic ester for reaction with a halogen at a polymer chain end. Exemplary end-capping reactants are halobenzenes, for example bromobenzene, and phenylboronic acid. End-capping reactants may be added during or at the end of the polymerisation reaction.

If a monomer carries a reactive substituent then the reactive substituent may react during polymerisation. For example, a crosslinkable substituent may undergo crosslinking during polymerisation to form an intractable crosslinked polymer in the reaction vessel.

Suzuki polymerisation is typically carried out at the reflux temperature of the polymerisation mixture. However, the present inventors have found that polymerisation may take place at lower temperatures with an appropriate catalyst. Lower temperature Suzuki polymerisation, for example in the range of 20-80° C., optionally 50-80° C., optionally 20-80° C. may be used to avoid reaction of reactive substituents during polymerisation. Optionally; polymerisation is carried out below the reflux temperature of the reaction mixture.

A Suzuki polymerisation reaction may include two or more different monomers of formula (IV) and/or two or more different monomers of formula (V). Different monomers of formula (IV) may have different reactivities, and so one monomer of formula (IV) in a polymerisation mixture may undergo polymerisation faster than another monomer of formula (IV) in the polymerisation mixture. The same applies if there are two or more different monomers of formula (V). This may lead to uneven distribution of repeat units within the polymer chain, with the concentration of the repeat unit derived from the lower reactivity monomer being higher at the polymer chain ends.

The present inventors have found that this difference in reactivity may be reduced by lower temperature polymerisation.

The polystyrene-equivalent number-average molecular weight (Mn) measured by gel permeation chromatography of the polymers described herein may be in the range of about $1 \times 10^3$ to $1 \times 10^8$, and preferably $1 \times 10^4$ to $5 \times 10^6$. The polystyrene-equivalent weight-average molecular weight (Mw) of the polymers described herein may be $1 \times 10^3$ to $1 \times 10^8$, and preferably $1 \times 10^4$ to $1 \times 10^7$.

Polymers as described herein are suitably amorphous.

Monomer (I)

The monomer of formula (I) may have formula (Ia):

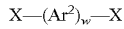

wherein $Ar^2$ in each occurrence is independently an aryl or heteroaryl group that may be unsubstituted or substituted with one or more substituents, w is a positive integer, optionally 1, 2 or 3; and X is as described above.

Exemplary aryl groups $Ar^2$ include phenyl, naphthalene, anthracene, fluorene, phenanthrene and 9,10-dihydrophenanthrene.

The monomer of formula (I) may have formula (Ib):

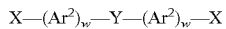

wherein $Ar^2$, w and X are described above and Y is a linking group. Exemplary linking groups include —$R^{12}C$=$CR^{12}$— and branched, linear or cyclic $C_{1-20}$ alkyl wherein one or more non-adjacent C atoms may be replaced by O, S, C=O, COO or $SiR^{12}_2$ wherein $R^{12}$ in each occurrence is H or a substituent, optionally H or a $C_{1-20}$ alkyl group.

Exemplary monomers of formula (Ia) and (Ib) include the following:

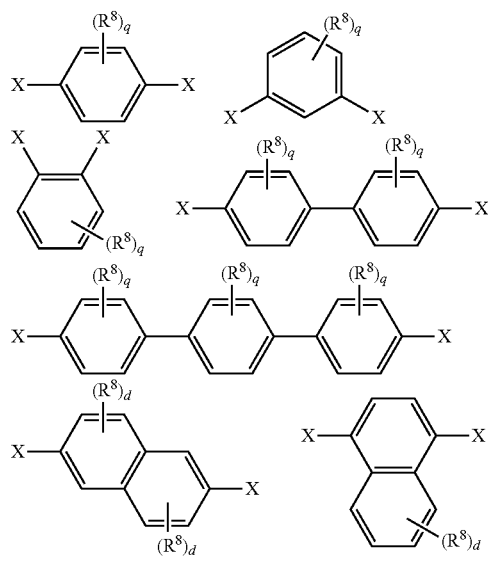

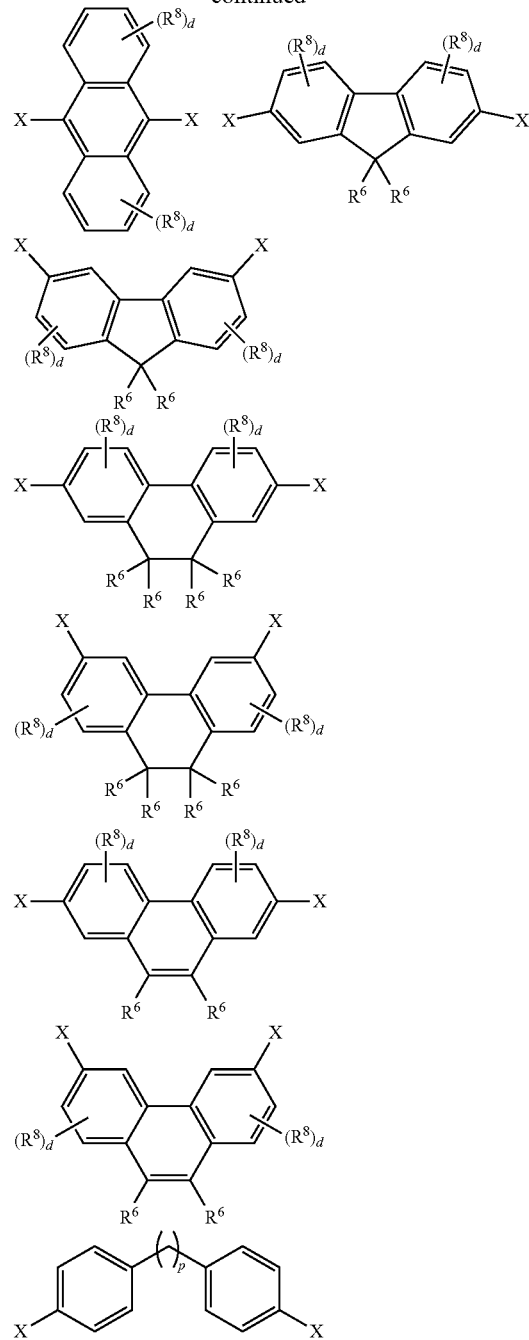

wherein q in each occurrence is 0, 1, 2, 3 or 4; d in each occurrence is 0, 1, 2 or 3; $R^6$ independently in each occurrence is a substituent and two groups $R^6$ may be linked to form a substituted or unsubstituted ring; p is 1-20; $R^8$ independently in each occurrence is a substituent; and X is as described above.

Substituents of $Ar^2$, including $R^6$ and $R^8$, may be selected from the group consisting of:

alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;

aryl and heteroaryl groups that may be unsubstituted or substituted with one or more substituents, preferably phenyl substituted with one or more $C_{1-20}$ alkyl groups;

a linear or branched chain of aryl or heteroaryl groups, each of which groups may independently be substituted, for example a group of formula —$(Ar^5)_r$, wherein each $Ar^5$ is independently an aryl or heteroaryl group and r is at least 2, preferably a branched or linear chain of phenyl groups each of which may be unsubstituted or substituted with one or more $C_{1-20}$ alkyl groups; and a crosslinkable-group, for example a group comprising a double bond such and a vinyl or acrylate group, or a benzocyclobutane group.

In the case where $R^6$ or $R^8$ comprises an aryl or heteroaryl group, or a linear or branched chain of aryl or heteroaryl groups, the or each aryl or heteroaryl group may be substituted with one or more substituents $R^7$ selected from the group consisting of:

alkyl, for example $C_{1-20}$ alkyl, wherein one or more non-adjacent C atoms may be replaced with O, S, substituted N, C=O and —COO— and one or more H atoms of the alkyl group may be replaced with F;

$NR^9_2$, $OR^9$, $SR^9$, $SiR^9_3$ and fluorine, nitro and cyano;

wherein each $R^9$ is independently selected from the group consisting of alkyl, preferably $C_{1-20}$ alkyl; and aryl or heteroaryl, preferably phenyl, optionally substituted with one or more $C_{1-20}$ alkyl groups.

Substituted N, where present, may be —$NR^9$— wherein $R^9$ is as described above.

Preferably, each $R^6$ and; where present, $R^8$ is independently selected from $C_{1-40}$ hydrocarbyl, and is more preferably selected from $C_{1-20}$ alkyl; unsubstituted phenyl; phenyl substituted with one or more $C_{1-20}$ alkyl groups; a linear or branched chain of phenyl groups, wherein each phenyl may be unsubstituted or substituted with one or more $C_{1-20}$ alkyl groups; and a crosslinkable group.

Monomer (II)

$Ar^1$ of the monomer of formula (II) may be a monocyclic or polycyclic aryl group that is unsubstituted or substituted with one or more substituents, for example unsubstituted or substituted phenylene, naphthalene, anthracene and fluorene.

n may be 1, 2 or 3. Preferably, n is 1 or 2 if $Ar^1$ is phenyl, and is 1 if $Ar^1$ is a polycyclic aromatic group.

In the monomer of formula (II) $R^2$, which may be the same or different in each occurrence when m>1, is preferably selected from the group consisting of alkyl, for example $C_{1-20}$ alkyl, $Ar^7$, a branched or linear chain of $Ar^7$ groups, or a crosslinkable substituent, wherein $Ar^7$ in each occurrence is independently optionally substituted aryl or heteroaryl. Optionally, $Ar^7$ is phenyl that may be unsubstituted or substituted with one or more $C_{1-20}$ alkyl groups.

Any of $Ar^1$ and, if present, $Ar^7$ in the repeat unit of Formula (II) may be linked by a direct bond or a divalent linking atom or group to another of $Ar^1$ and $Ar^7$. Preferred divalent linking atoms and groups include O, S; substituted N; and substituted C.

$Ar^7$ may be substituted with one or more substituents. Exemplary substituents are substituents $R^{12}$, wherein each $R^{12}$ may independently be selected from the group consisting of:

substituted or unsubstituted alkyl, optionally $C_{1-20}$ alkyl, wherein one or more non-adjacent C atoms may be replaced with optionally substituted aryl or heteroaryl, O, S, substituted N, C=O or —COO— and one or more H atoms may be replaced with F; and a crosslinkable group Exemplary groups $Ar^1$ include the following:

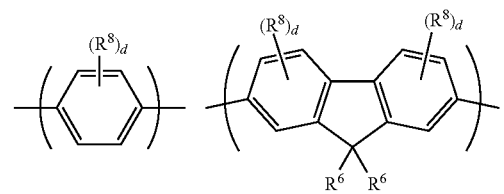

wherein $R^8$, $R^6$ and d are as described above.

Exemplary monomers of formula (II) include the following:

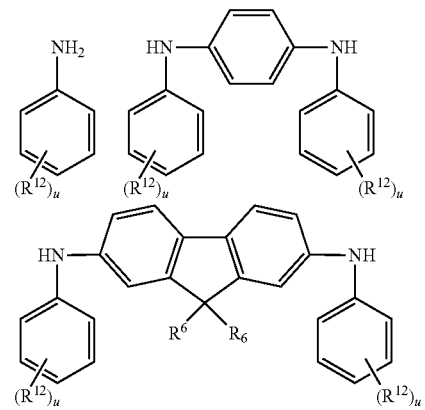

wherein u is 0, 1, 2, 3, 4 or 5.

Crosslinkable substituents as described anywhere herein may be selected from groups of the following formulae:

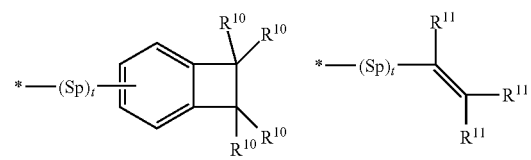

wherein Sp is a spacer group; t is 0 or 1; $R^{10}$ in each occurrence is H, $C_{1-10}$ alkyl or $C_{1-10}$ alkoxy; $R^{11}$ is H or $C_{1-10}$alkyl; and * represents a point of attachment of the crosslinkable substituent to the monomer. Exemplary spacer groups are $C_{1-20}$ alkyl, phenyl and phenyl-$C_{1-20}$ alkyl. One or more C atoms an alkyl of a spacer group Sp may be replaced with O or S.

Monomers (IV) and (V)

$R^{13}$ or $R^{14}$ of monomers of formulae (IV) and (V) respectively may each be selected from:

(a) groups of formula —$(Ar^6)_v$— wherein $Ar^6$ in each occurrence is independently an aryl or heteroaryl group that may be unsubstituted or substituted with one or more substituents and v is a positive integer, optionally 1, 2 or 3; and (b) groups of formula (VII):

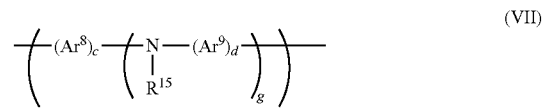

(VII)

wherein $Ar^8$ and $Ar^9$ in each occurrence are independently selected from substituted or unsubstituted aryl or heteroaryl, g is greater than or equal to 1, preferably 1 or 2, $R^{15}$ is H or a substituent, preferably a substituent; c and d are each independently 1, 2 or 3; and any two of $Ar^8$, $Ar^9$ and $R^{15}$ directly linked to a common N atom may be linked by a direct bond or a divalent linking group.

Exemplary groups of formula $-(Ar^6)_v-$ include the following:

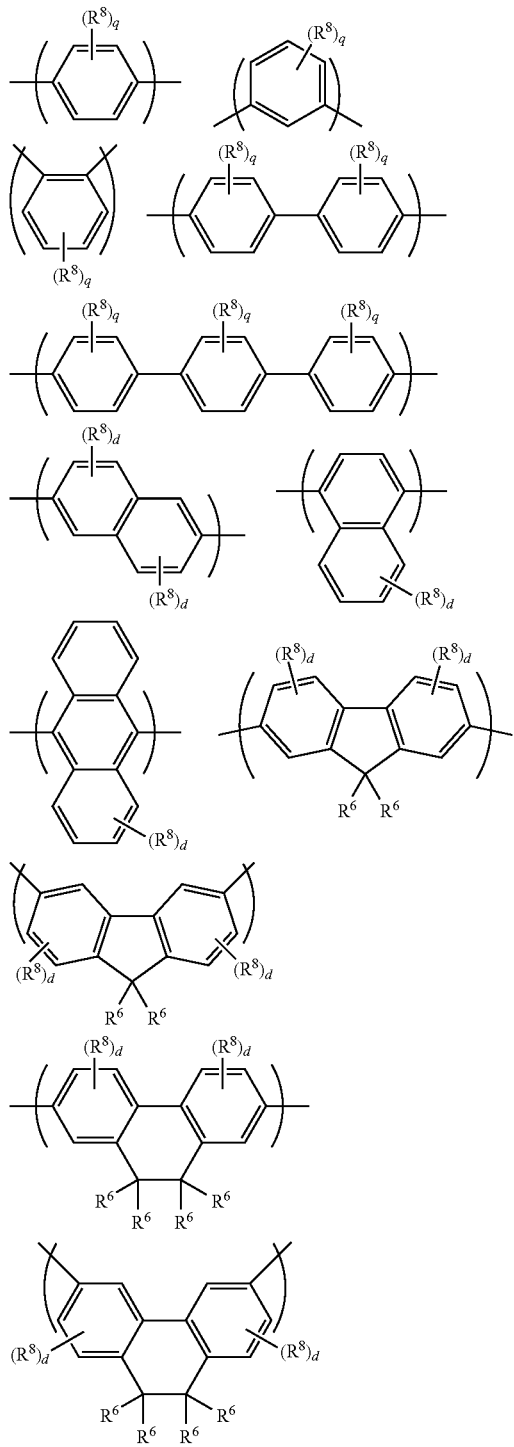

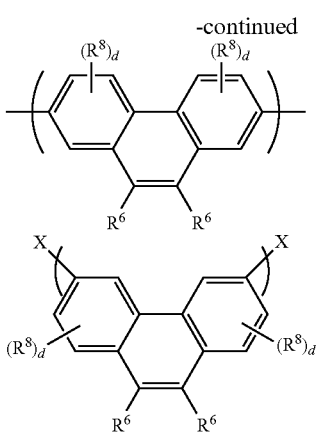

wherein q, d, $R^6$ and $R^8$ are as described above.

R13 or R14 may have the following formula:

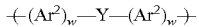

Wherein Ar2, w and Y are as described above. An exemplary repeat unit of this formula has the following structure, in which p is 1-20:

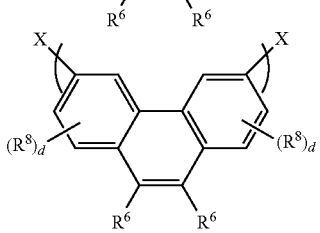

With reference to groups of formula (VII), $R^{15}$, which may be the same or different in each occurrence when g>1, is preferably selected from the group consisting of alkyl, for example $C_{1-20}$alkyl, $Ar^{10}$, a branched or linear chain of $Ar^{10}$ groups, or a crosslinkable unit that is bound directly to the N atom of formula (VII) or spaced apart therefrom by a spacer group, wherein $Ar^{10}$ in each occurrence is independently optionally substituted aryl or heteroaryl. Exemplary spacer groups are $C_{1-20}$ alkyl, phenyl and phenyl-$C_{1-20}$ alkyl.

Any two of $Ar^8$, $Ar^9$ and, if present, $Ar^{10}$ in the repeat unit of Formula (VII) directly linked to the same N atom may be linked by a direct bond or a divalent linking group. Preferred divalent linking atoms and groups include O, S; substituted N; and substituted C.

Any of $Ar^8$, $Ar^9$ and, if present, $Ar^{10}$ may be substituted with one or more substituents. Exemplary substituents are substituents $R^{10}$, wherein each $R^{10}$ may independently be selected from the group consisting of substituted or unsubstituted alkyl, optionally $C_{1-20}$alkyl, wherein one or more non-adjacent C atoms may be replaced with optionally substituted aryl or heteroaryl, O, S, substituted N, C=O or —COO— and one or more H atoms may be replaced with F; and a crosslinkable group Preferred repeat units of formula (VII) have formulae 1-3:

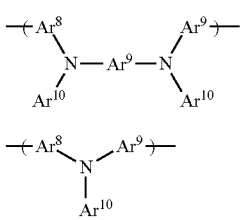

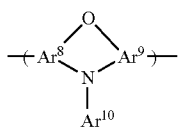

In one preferred arrangement, $R^{15}$ is $Ar^{10}$ and each of $Ar^8$, $Ar^9$ and $Ar^{10}$ are independently and optionally substituted with one or more $C_{1-20}$ alkyl groups. $Ar^8$, $Ar^9$ and $Ar^{10w}$ are preferably phenyl.

In another preferred arrangement, the central $Ar^9$ group of formula (I) linked to two N atoms is a polycyclic aromatic that may be unsubstituted or substituted with one or more substituents $R^{10}$. Exemplary polycyclic aromatic groups are naphthalene, perylene, anthracene and fluorene.

In another preferred arrangement, $Ar^8$ and $Ar^9$ are phenyl, each of which may be substituted with one or more $C_{1-20}$ alkyl groups, and $R^{15}$ is —$(Ar^{10})_r$ wherein r is at least 2 and wherein the group —$(Ar^{10})_r$ forms a linear or branched chain of aromatic or heteroaromatic groups, for example 3,5-diphenylbenzene wherein each phenyl may be substituted with one or more $C_{1-20}$ alkyl groups. In another preferred arrangement, c, d and g are each 1 and $Ar^8$ and $Ar^9$ are phenyl linked by an oxygen atom to form a phenoxazine ring.

Monomers comprising groups of formula (VII) preferably have halide, sulfonic acid or sulfonic ester leaving groups LG1 or LG2.

Applications

Polymers prepared by methods of the invention may be used in a wide range of applications including, without limitation, printed organic circuits and in organic electronic devices such as organic light emitting diodes (OLEDs), organic photoresponsive devices (in particular organic photovoltaic devices and organic photosensors), organic transistors and memory array devices. A polymer in an organic light-emitting device may be used as a charge-transporting material of a charge transporting layer; a light-emitting material of a light-emitting layer; or a host polymer of a light-emitting layer.

A film or pattern of a polymer may be applied on a surface by applying a formulation containing the polymer dispersed or dissolved in one or more solvents, followed by evaporation of the solvent or solvents. Suitable deposition methods include coating and printing methods. Coating methods include spin-coating, dip-coating, roller coating and doctor blade coating. Printing methods include flexographic printing, nozzle printing and inkjet printing.

Certain deposition methods may require the formulation to have a viscosity within a defined range. Viscosity of the formulation may depend at least in part on the molecular weight of the polymer, which may be controlled as described above in order to provide a desired viscosity.

Polymers may be n-doped to increase conductivity of the polymer.

Polymers may be used as host materials doped with a fluorescent or phosphorescent light-emitting dopant.

EXAMPLES

Buchwald Polymerisation

A mixture of diamine- and dibromo-monomers in xylene was placed in a reaction flask and saturated with nitrogen. A palladium catalyst and sodium tert-butoxide were added and the mixture was heated to 115° C. and stirred for 4 hours, after which the reaction was terminated by refluxing with p-ditolylamine in the presence of fresh catalyst and base for 14 hours.

TABLE 1

| | Composition | | | | | | |
|---|---|---|---|---|---|---|---|
| Polymer | Amine monomer (mol %) | Dibromo monomer (mol %) | Catalyst | Mw | Mp | Mn | Pd |
| Comparative Polymer 1 | 1 (50) | 3 (10) 2 (40) | 0.5% Pd$_2$dba$_3$, 1% HtBu$_3$PBF$_4$ | 201,000 | 197,000 | 30,000 | 6.69 |
| Comparative Polymer 2 | 1 (50) | 3 (10) 2 (40) | 0.5% Pd$_2$dba$_3$, 1% BINAP | 103,000 | 83,000 | 24,000 | 4.21 |
| Polymer Example 1 | 1 (50) | 3 (10) 2 (40) | 1% Pd(P$^t$Bu$_3$)$_2$ | 234,000 | 216,000 | 48,000 | 4.78 |
| Polymer Example 2 | 1 (50) | 3 (10) 2 (40) | 1% PdCl$_2$(P$^t$Bu$_2$PPh)$_2$ | 767,000 | 587,000 | 182,000 | 4.22 |
| Polymer Example 3 | 1 (49.5) | 3 (10) 2 (40) | 1% PdCl$_2$ (P$^t$Bu$_2$PPh)$_2$ | 198,000 | 158,000 | 33,000 | 6.06 |

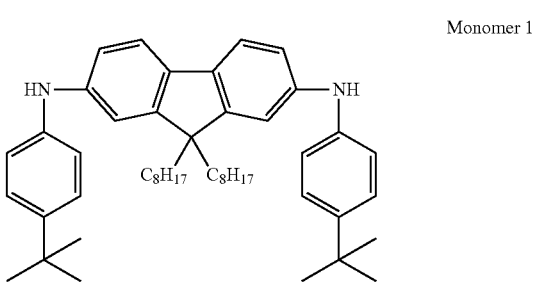

Monomer 1

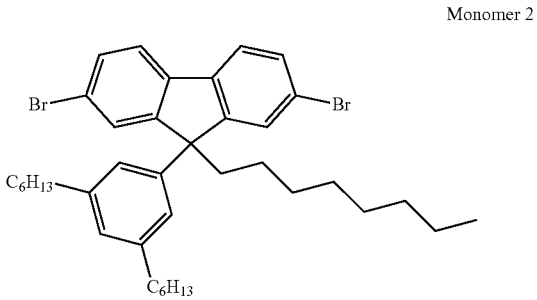

Monomer 2

-continued

Monomer 3

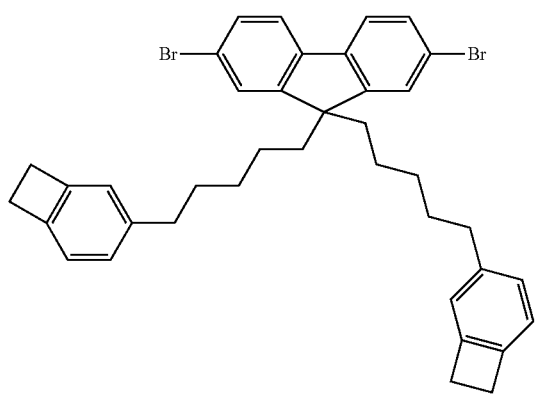

BINAP has the following structure:

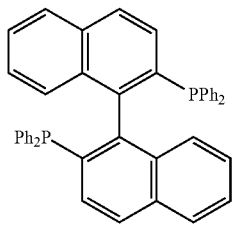

Molecular weight of Comparative Polymers 1 and 2, formed using the catalyst Pd₂dba₃, are lower than those of Polymer Examples 1 and 2 formed using a catalyst according to the method of the invention.

A comparison of Polymer Example 2 and Polymer Example 3 shows the control over molecular weight that can be achieved by varying the amine monomer:dibromo monomer ratio. Accordingly, the method of the invention may enable formation of polymers having molecular weight ranging up to very high molecular weights.

Suzuki Polymerization

Polymers were formed using monomers illustrated below and using the catalysts and polymerization temperatures set out in Table 2.

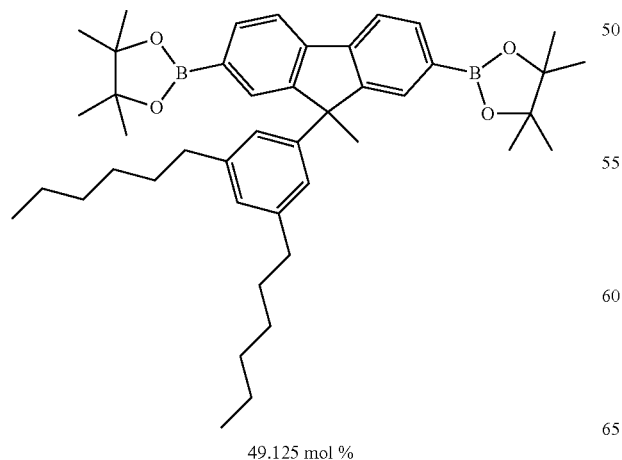

49.125 mol %

-continued

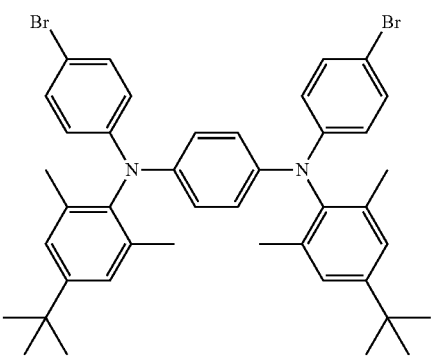

5 mol %

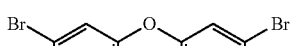

1 mol %

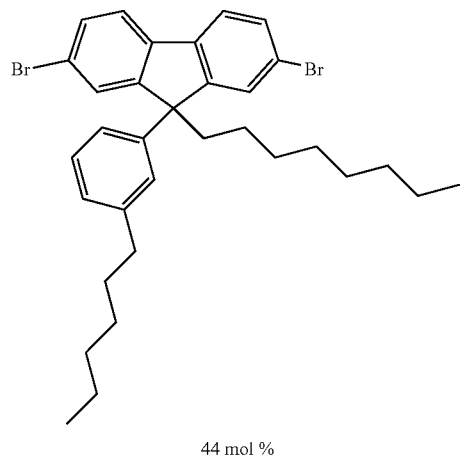 [SMILES: CCCCCCCCC1(c2cccc(CCCCCC)c2)c2cc(Br)ccc2-c2ccc(Br)cc21]

44 mol %

TABLE 2

| Polymer | Catalyst | Temp (° C.) | Mz | Mw | Mp | Mn | Pd |
|---|---|---|---|---|---|---|---|
| Comparative Polymer 2 | PdCl$_2$(P(PhOMe)$_3$)$_2$ | 115 | 380,000 | 217,000 | 198,000 | 84,000 | 2.60 |
| Comparative Polymer 3 | PdCl$_2$(P(PhOMe)$_3$)$_2$ | 80 | 234,000 | 137,000 | 127,000 | 59,000 | 2.60 |
| Comparative Polymer 4 | PdCl$_2$(P(PhOMe)$_3$)$_2$ | 65 | 170,000 | 97,000 | 92,000 | 39,000 | 2.50 |
| Polymer Example 4 | PdCl$_2$(tBu$_2$PPh)$_2$ | 65 | 577,000 | 330,000 | 303,000 | 125,000 | 2.64 |

As shown in Table 2, the molecular weights of polymers formed using comparative catalyst PdCl$_2$(P(PhOMe)$_3$)$_2$ falls as the polymerisation temperature falls.

Polymerisation at 65° C. according to a method of the invention using PdCl$_2$(tBu$_2$PPh)$_2$ catalyst according to an embodiment of the invention produces polymers of higher molecular weight than any of the polymers formed using the comparative catalyst.

Device Examples

The polymers formed were used as the light-emitting materials of an OLED having the following structure:

ITO/HIL/HTL/LE/Cathode wherein ITO is an indium-tin oxide anode; HIL is a hole-injecting layer; HTL is a hole-transporting layer; LE is a light-emitting layer; and the cathode comprises a layer of metal fluoride in contact with the light-emitting layer and a layer of aluminium formed over the layer of metal fluoride.

To form the device, a substrate carrying ITO was cleaned using UV/Ozone. The hole injection layer was formed by spin-coating an aqueous formulation of a hole-injection material available from Plextronics, Inc, A crosslinkable hole transporting layer was formed to a thickness of 20 nm by spin-coating a hole-transporting polymer formed by Suzuki polymerization and containing fluorene repeat units and amine repeat units of formula (VII); and crosslinking the polymer by heating. A light-emitting layer was formed by spin-coating a polymer as described in the polymer examples. A cathode was formed by evaporation of a first layer of a metal fluoride to a thickness of about 2 nm, a second layer of aluminium to a thickness of about 200 nm and a third layer of silver.

The device containing the exemplary polymer formed by low-temperature Suzuki polymerization had a maximum quantum efficiency of about 7.1%, whereas the comparative polymer formed by higher temperature Suzuki polymerization had a quantum efficiency of about 6.4%. The time taken for lifetime of the two devices to fall to 50% of an initial luminance was similar.

Without wishing to be bound by any theory, it is believed that difference in reactivity of the dibromo-monomers is smaller at lower polymerisation temperatures, and so these monomers are more evenly distributed in the polymer chain than in the comparative polymer formed by higher temperature polymerization.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A method of forming a polymer by polymerising a composition comprising at least one monomer of formula (I) and at least one monomer of formula (II):

wherein:
$R^1$ comprises an aromatic group that may be unsubstituted or substituted with one or more substituents;
$R^2$ independently in each occurrence is a substituent;
$Ar^1$ independently in each occurrence is an aryl or heteroaryl group that may be unsubstituted or substituted with one or more substituents;
X independently in each occurrence is selected from bromine, chlorine, iodine and sulfonic acid esters, and each X is bound to an aromatic carbon atom of $R^1$;
n is a positive integer;
m is 0 or a positive integer; and
the monomers are polymerised in the presence of a preformed palladium catalyst of formula (III):

wherein $R^3$ in each occurrence is independently selected from $C_{1-10}$ alkyl, phenyl, and phenyl substituted with one or more $C_{1-5}$ alkyl groups, wherein at least one $R^3$ of at least one group $PR^3_3$ is $C_{1-10}$ alkyl and at least one $R^3$ of the at least one group $PR^3_3$ is phenyl that may be unsubstituted or substituted with one or more $C_{1-5}$ alkyl groups;
y is 0 or 2; and
$Z^-$ is an anion.

2. The method according to claim 1 wherein the monomer of formula (I) has formula (Ia):

wherein $Ar^2$ in each occurrence is an aryl or heteroaryl group that may be unsubstituted or substituted with one or more substituents, and w is a positive integer.

3. The method according to claim 2 wherein w is 1, 2 or 3.

4. The method according to claim 2 wherein $Ar^2$ is an aryl group that may be unsubstituted or substituted with one or more substituents.

5. The method according to claim 1 wherein $Z^-$ is a halide.

6. The method according to claim 1 wherein n is 1, 2 or 3.

7. The method according to claim 1 wherein m is 0 or 1.

8. The method according to claim 1 wherein $Ar^1$ is selected from phenylene and fluorene, each of which may be unsubstituted or substituted with one or more substituents.

9. The method according to claim 1 wherein each $R^2$ is independently selected from $C_{1-20}$ alkyl; aryl that may be unsubstituted or substituted with one or more substituents; and a branched or linear chain of aryl groups wherein each aryl group may be unsubstituted or substituted with one or more substituents.

10. The method according to claim 1 wherein a molar ratio of the at least one monomer of formula (I) and the at least one monomer of formula (II) is 50:50.

11. The method according claim 1 wherein a molar ratio of the at least one monomer of formula (I) and the at least one monomer of formula (II) is not 50:50.

12. The method according to claim 11 wherein a number of moles of the at least one monomer of formula (II) is greater than a number of moles of the at least one monomer of formula (I).

* * * * *